United States Patent
Canestrari et al.

(10) Patent No.: US 9,698,572 B1
(45) Date of Patent: Jul. 4, 2017

(54) SPARK PLUG RFI SUPPRESSION SLEEVE

(71) Applicant: Fenix Manufacturing Solutions, LLC, Aiken, SC (US)

(72) Inventors: David Warren Canestrari, Warrenville, SC (US); Rickey Shon Burchett, Aiken, SC (US)

(73) Assignee: Fenix Manufacturing Solutions, LLC, Aiken, SC (US)

( * ) Notice: Subject to any disclaimer, the term of this patent is extended or adjusted under 35 U.S.C. 154(b) by 114 days.

(21) Appl. No.: 14/472,992

(22) Filed: Aug. 29, 2014

Related U.S. Application Data

(60) Provisional application No. 61/872,261, filed on Aug. 30, 2013.

(51) Int. Cl.
*H01T 13/05* (2006.01)
*F02P 13/00* (2006.01)
*H01T 13/12* (2006.01)
*H05K 9/00* (2006.01)

(52) U.S. Cl.
CPC .............. *H01T 13/05* (2013.01); *F02P 13/00* (2013.01); *H01T 13/12* (2013.01); *H05K 9/0064* (2013.01)

(58) Field of Classification Search
CPC ......... H01T 13/00; H01T 13/05; H01T 13/06; H01T 13/34; H01T 13/38; H01T 13/41; H01T 13/12; F02P 13/00; H05K 9/0064
See application file for complete search history.

(56) References Cited

U.S. PATENT DOCUMENTS

| | | | | |
|---|---|---|---|---|
| 4,145,106 A | * | 3/1979 | Livingston | H01T 13/06 123/169 PH |
| 4,514,712 A | * | 4/1985 | McDougal | H01F 38/12 123/169 PA |
| 4,529,257 A | * | 7/1985 | Goodman | H01R 13/65802 174/359 |
| 4,671,586 A | * | 6/1987 | DeBolt | H01T 13/05 439/126 |
| 7,455,534 B1 | * | 11/2008 | Fredericksen | H01R 4/646 439/92 |
| 7,944,364 B1 | * | 5/2011 | Bodkin, Sr. | H02H 11/002 340/4.36 |

\* cited by examiner

*Primary Examiner* — Stephen K Cronin
*Assistant Examiner* — Jacob Amick
(74) *Attorney, Agent, or Firm* — Nelson Mullins Riley & Scarborough, LLP

(57) ABSTRACT

A spark plug RFI suppression arrangement comprises a spark plug having a proximal end at which an ignition terminal is located and a distal end at which a pair of electrodes are separated by a spark gap. The spark plug further has an insulator portion and a conductive case located intermediate the proximal and distal ends. The arrangement further has an ignition wire having an end portion carrying a connector removably attached to the ignition terminal of the spark plug. A spark plug boot is located at the end portion of the ignition wire, the boot being configured to cover the connector and at least a portion of the spark plug. A radio frequency interference (RFI) suppression sleeve is connected to the spark plug boot and is in electrical communication with the conductive case of the spark plug such that interference produced by operation of the spark plug is suppressed by grounding through the conductive case.

14 Claims, 4 Drawing Sheets

SPARK PLUG RFI SUPPRESSION SLEEVE

This application claims the benefit of U.S. provisional patent application Ser. No. 61/872,261, filed Aug. 30, 2013, which is relied upon and incorporated herein by reference in its entirety.

BACKGROUND OF THE INVENTION

The present invention relates to the art of ignition systems for spark ignited internal combustion engines. More particularly, the present invention relates to a sleeve that can be removably connected to a spark plug boot for suppression of radio frequency interference (RFI) otherwise emitted by the spark plug.

Spark ignited internal combustion engines utilize spark plugs mounted in the engine block to produce the spark needed to ignite the air-fuel mixture inside the piston cylinder. The high voltage spark can emit radio frequency interference (RFI) away from the engine. There is a concern that this RFI could impede the proper operation of various radio transceivers located nearby.

The present invention recognizes the foregoing considerations, and others, of the prior art.

SUMMARY OF THE INVENTION

In accordance with one aspect, the present invention provides a spark plug RFI suppression arrangement comprising a spark plug having a proximal end at which an ignition terminal is located and a distal end at which a pair of electrodes are separated by a spark gap. The spark plug further has an insulator portion and a conductive case located intermediate the proximal and distal ends. The arrangement further has an ignition wire having an end portion carrying a connector removably attached to the ignition terminal of the spark plug. A spark plug boot is located at the end portion of the ignition wire, the boot being configured to cover the connector and at least a portion of the spark plug. A separate radio frequency interference (RFI) suppression sleeve is connected to the spark plug boot and is in electrical communication with the conductive case of the spark plug such that interference produced by operation of the spark plug is suppressed by grounding through the conductive case.

In an exemplary embodiment, the suppression sleeve has a cylindrical configuration with a first smaller diameter portion and a second larger diameter portion, a portion of the spark plug boot being received in the first smaller diameter portion. Preferably, the suppression sleeve comprises an elastomeric material having conductive properties. For example, the elastomeric material may be selected from the group consisting of conductive polymer and conductive silicone. In addition, many embodiments of the suppression sleeve may comprise a metallic conductor embedded in the elastomeric material. The metallic conductor may comprise, for example, a wire coil or a wire mesh.

Typically, the conductive case of the spark plug may include an integral nut defining a plurality of wrench flats about its periphery wherein a second larger diameter portion of the suppression sleeve may cover at least some of the nut. In such embodiments, the suppression sleeve may preferably have a length such that it will partially cover the nut but not contact directly the engine block to which the spark plug is attached. Often, the spark plug boot may have a main cover portion and an angled portion extending along the ignition wire in which event the first smaller diameter portion of the suppression sleeve may abut the angled portion.

In accordance with another aspect, the present invention provides a radio frequency interference (RFI) suppression sleeve for use with a spark plug boot. The sleeve comprises a sleeve body formed of an elastomeric material having conductive properties and a metallic conductor embedded in the elastomeric material. The sleeve body has a generally cylindrical configuration with a first smaller diameter portion and a second larger diameter portion. The first smaller diameter portion is sized for receipt of a main cover portion of a spark plug boot. The second larger diameter portion is sized for receipt of an integral nut located on a spark plug.

A further aspect of the present invention provides a method of suppressing radio frequency interference (RFI) generated by a spark plug. One step of the method involves acquiring a radio frequency interference (RFI) suppression sleeve having a generally cylindrical sleeve body formed of a conductive elastomeric material and a metallic conductor embedded in the elastomeric material. According to another step of the method, a main cover portion of a spark plug boot is inserted into one open end of the sleeve such that a first portion of the sleeve will be overlapping some of the spark plug boot but a second portion of the sleeve will extend beyond the spark plug boot. A further step of the method involves attaching a connector of an ignition wire to the terminal of a spark plug such that the spark plug boot covers a portion of the spark plug and the second portion of the sleeve covers an additional portion of the spark plug such that the second portion of the sleeve is in contact with a conductive case on the spark plug.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
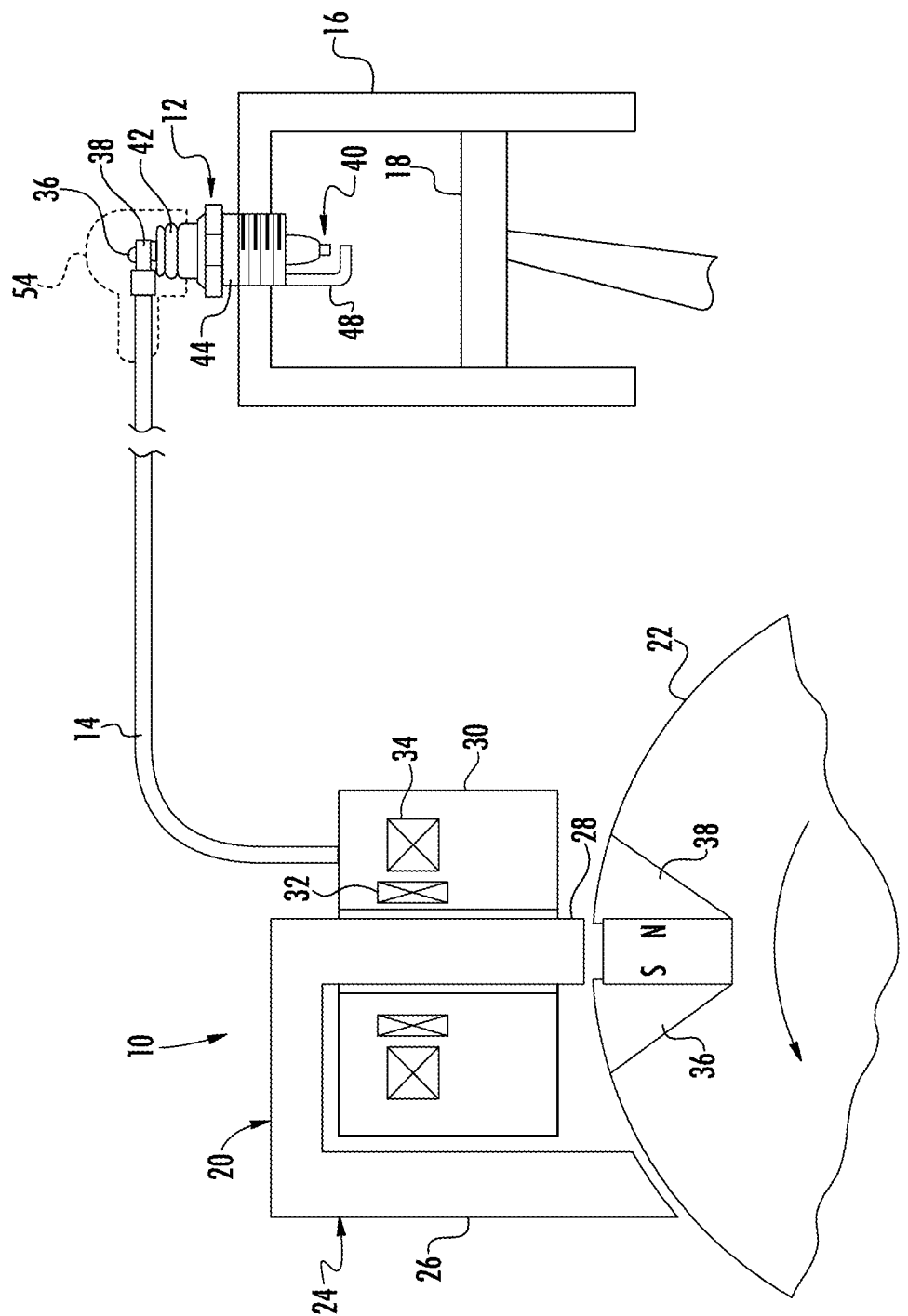
FIG. 1 is a diagrammatic representation showing various components of a spark ignition system in an internal combustion engine of the prior art.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary constructions.

FIG. 1 illustrates components of a typical spark ignited internal combustion engine of the prior art with which aspects of the present invention may be used. As shown, an ignition 10 is connected to spark plug 12 via ignition wire 14. The requisite spark is thus produced at spark plug 12 to ignite the air-fuel mixture within the piston cylinder defined by the engine block 16. As a result, piston 18 will reciprocate inside the cylinder.

Generally, ignition 10 includes a stator unit 20 and a rotatable flywheel 22. Flywheel 22 typically defines a central bore for mounting to a rotatable spindle mechanically interconnected with the engine's drive shaft. Rotation of the spindle will thus produce a concomitant rotation of flywheel 22 (such as in the direction indicated by the arrow). Stator unit 20, which remains fixed with respect to the engine during use, includes a magnetically permeable core 24. In this case, core 24 includes two depending leg portions, respectively indicated at 26 and 28.

A sealed housing 30 contains the various coils and other components utilized to produce a spark at spark plug 12. In particular, housing 30 includes a transformer having a primary coil 32 and a secondary coil 34 which are, in this case, mounted coaxially about leg portion 28. The various components within housing 30 are typically protected and maintained securely in position via a potting compound.

A magnet assembly is mounted adjacent the periphery of flywheel 22 to orbit about a circular path in synchronism with operation of the engine. The magnet assembly includes a permanent magnet having pole pieces 36 and 38 mounted at respective ends thereof. It will be appreciated that the circumferential faces of pole pieces 36 and 38 will pass proximate to the end faces of leg portions 26 and 28 as flywheel 22 is rotated. Rotation of flywheel 22 thus produces a time-varying magnetic flux within core 24, as desired. The transformer steps up the voltage at primary coil 32 according to the winding ratio.

Certain additional details about the construction of spark plug 12 will now be described. As shown, spark plug 12 includes an ignition terminal 36 at one end thereof for removable attachment of a connector 38. Connector 38 is located at the end portion of ignition wire 14 to provide electrical communication between spark plug 12 and ignition 10. The electrodes defining the spark gap are located at the opposite end of spark plug 12, as indicated at 40. A ceramic insulator portion 42 and a metal conductive case 44 are located intermediate terminal 36 and electrodes 42.

Figure 2:
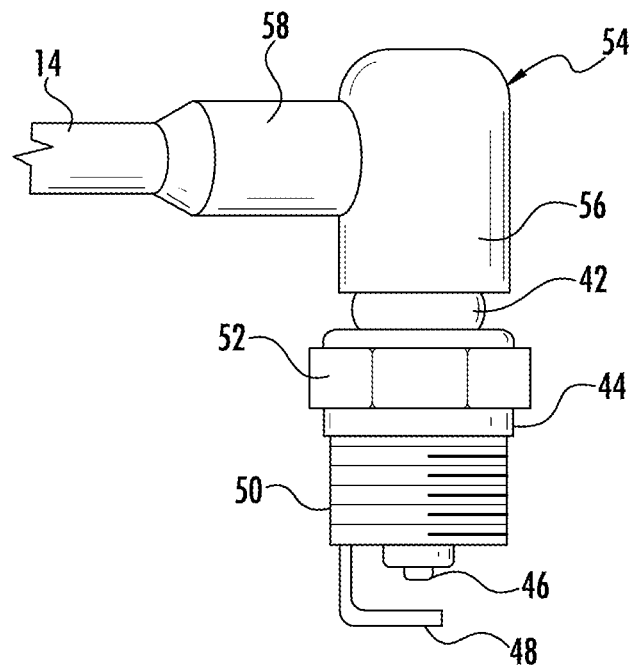
FIG. 2 is an enlarged elevation showing a spark plug and spark plug boot of the prior art.

Referring now also to FIG. 2, insulator portion 42 insulates inner electrode 46, whereas conductive case 44 provides a path to ground for outer electrode 48. In this regard, conductive case 44 defines a threaded portion 50 by which it engages a threaded aperture in the engine block. Conductive case 44 may also typically include an integral nut 52 defining a plurality of flats about its periphery for engagement by a wrench. As known to those skilled in the art, the wrench is used for installation and removal of the spark plug.

A spark plug boot 54 is located at the end of ignition wire 14. Boot 54 is essentially a flexible shroud that insulates from the outside world the high voltage location at which connector 38 is attached to terminal 36. In this regard, boot 54 includes a main cover portion 56 in which some of spark plug 12 is received, and an angled portion 58 that extends part of the way along ignition wire 14. Because boot 54 is made of an insulative elastomeric material (such as rubber), it does not provide RFI shielding.

Figure 3:
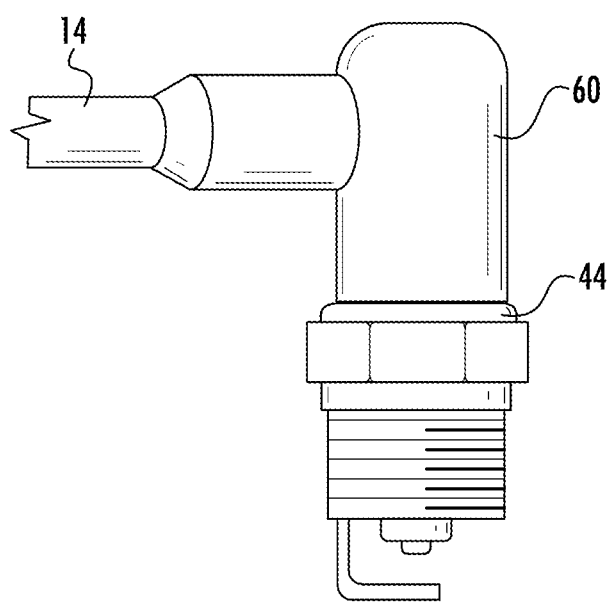
FIG. 3 is an enlarged elevation showing a spark plug and an alternative spark plug boot of the prior art.

FIG. 3 illustrates a spark plug boot of the prior art which provides shielding from RFI generated by the ignition spark. In this case, boot 60 is formed having an inner layer of insulative elastomeric material coated with an outer layer of conductive silicone. In addition, the main cover portion of boot 60 has a longer length than that of boot 54 such that it contacts conductive case 44 of the spark plug.

Figure 4:
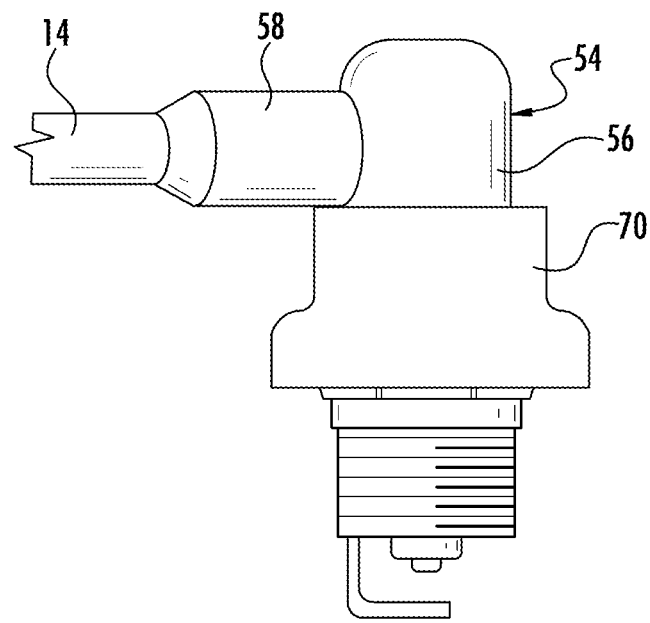
FIG. 4 is an enlarged elevation showing a spark plug and spark plug boot equipped with a radio frequency interference suppression sleeve in accordance with the present invention.

Referring now to FIGS. 4-7, a radio frequency interference suppression sleeve 70 is illustrated in accordance with an embodiment of the present invention. As can be seen in FIG. 4, sleeve 70 is received over the main cover portion 56 of spark plug boot 54 to inhibit emission of RFI produced by the ignition spark. In this embodiment, sleeve 70 has an axial length such that it abuts angled portion 58 of spark plug boot 54 at one end. A portion of sleeve 70 preferably extends beyond boot 54 such that it covers and contacts the spark plug's conductive case 44. As will be explained more fully below, sleeve 70 is preferably formed of an elastomeric material having suitable conductive characteristics. This serves to ground RFI to the engine's block.

Preferably, sleeve 70 will cover much of the portion of conductive case 54 that is outside of the engine block. It will often be desirable, however, for sleeve 70 to be spaced apart slightly from the engine block when installed. This is to reduce undesirable heat transfer from the engine block to sleeve 70 during operation of the engine. At the same time, much of the RFI energy emitted at the spark will be captured.

Figure 5:
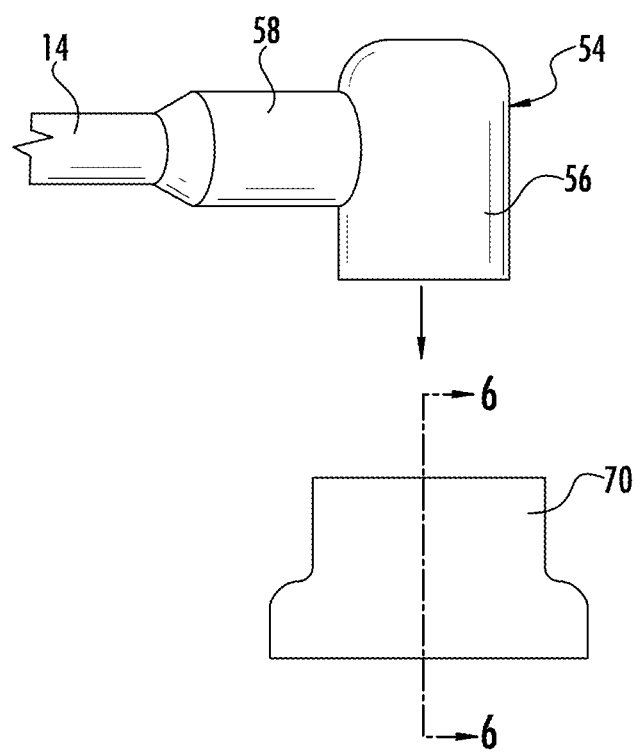
FIG. 5 shows removal of the suppression sleeve from the spark plug boot of FIG. 4.

Although sleeve 70 may be permanently attached to spark plug boot 54 (such as using a suitable adhesive), it will often be desirable to permit removal of sleeve 70. In other words, sleeve 70 is preferably sized to receive snugly and overlap some of main cover portion 56 of boot 54. As a result, sleeve 70 will be maintained together with boot 54 by friction in this embodiment. But, as shown in FIG. 5, it will be possible to pull sleeve 70 apart from boot 54 if desired. As a result, the sleeve can be removed if unnecessary in a particular situation. Moreover, the removable nature of the sleeve allows it to be applied to existing engines as a retrofit.

Figure 6:
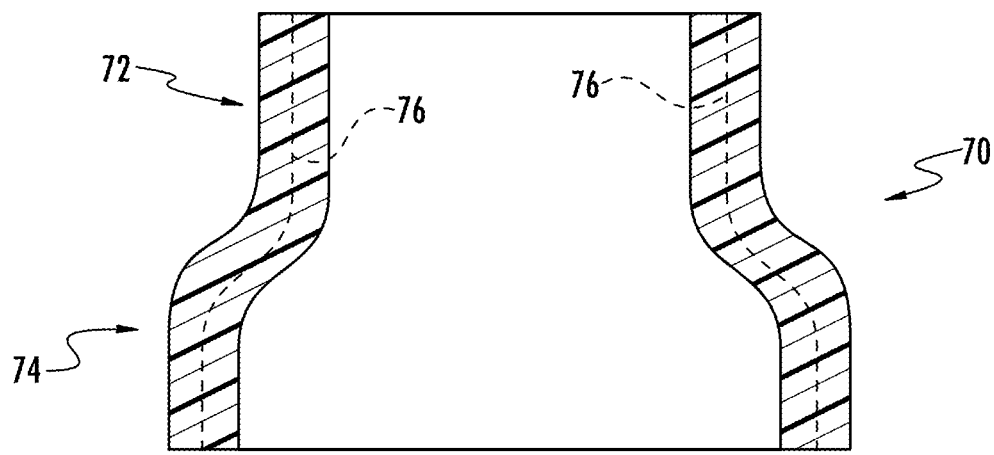
FIG. 6 is a cross-sectional view of the suppression sleeve taken along line 6-6 of FIG. 5.
Figure 7:
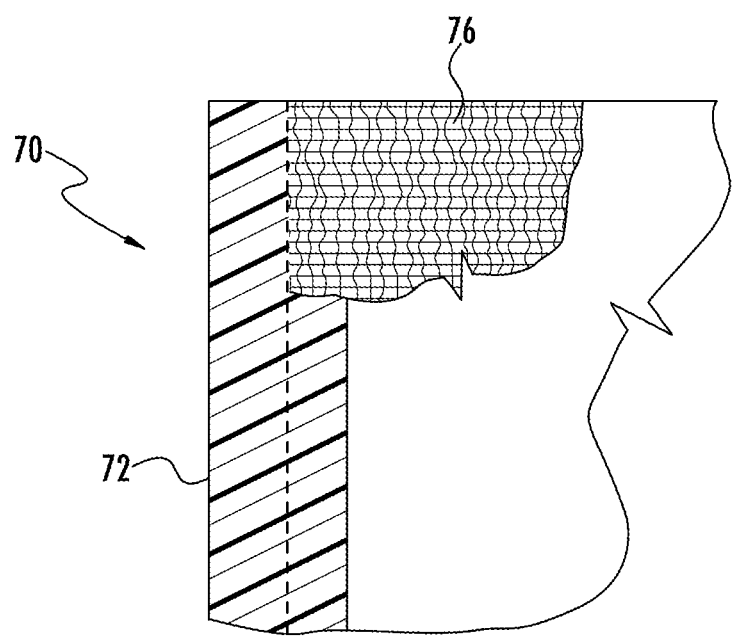
FIG. 7 is an enlarged fragmentary view of a portion of the suppression sleeve of FIG. 6 showing an internal metallic conductor.

As can be seen most clearly in FIG. 6, sleeve 70 may be configured having a smaller diameter first portion 72 at its "upper" end and a larger diameter second portion 74 at its "lower" end. First portion 72 is sized to receive main cover portion 56 of boot 54 as described above. Second portion 74 flares out to accommodate conductive case 44 of the spark plug. Preferably, the inner diameter of second portion 54 will engage at least the vertices between the flats of nut 52 to provide RFI grounding.

As noted above, sleeve 70 is preferably formed of an elastomeric material having suitable conductive properties. The material should also be flexible, resilient, and able to withstand heat generated by operation of the engine without premature degradation. It is contemplated that various conductive polymers and conductive silicones will constitute suitable materials. For example, heat resistant silicone having embedded carbon or other conductive particles suitable to produce the desired degree of conductivity may be used for this purpose. Preferably, heat resistance of the material may be at least about 350° F., and may preferably fall in a range of 350-500° F.

In preferred embodiments, a metallic conductor 76 is embedded in the elastomeric material of sleeve 70 to enhance RFI suppression. This can be most clearly seen in FIG. 7, where a portion of the elastomeric material is removed to show the embedded conductor. The conductor may comprise, for example, a mesh or coil of small gauge wire (such as copper wire) that extends around the entire cylinder of sleeve 70. As a result, the wire functions as a "fence" for capturing the emitted RFI. The RFI will thus be immediately grounded to the engine's block through the conductive elastomer. One skilled in the art will appreciate that boot 54 will continue to insulate terminal 36 as before.

It can thus be seen that the present invention provides an effective RFI suppression arrangement for use with a spark plug of an internal combustion engine. While preferred embodiments of the invention have been shown and described, modifications and variations may be made thereto by those of ordinary skill in the art without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to be limitative of the invention as further described in the appended claims.

What is claimed is:

1. A spark plug RFI suppression arrangement for use in an ignition system comprising:
   a spark plug having a proximal end at which an ignition terminal is located and a distal end at which a pair of electrodes are separated by a spark gap, said spark plug further having an insulator portion and a conductive case located intermediate said proximal end and said distal end;
   an ignition wire having an end portion carrying a connector removably attached to said ignition terminal of said spark plug;
   a spark plug boot located at said end portion of said ignition wire, said boot having a main cover portion configured to cover said connector and at least a portion of said spark plug, said main cover portion of said boot formed of an insulative elastomeric material and defining an outer circumferential surface; and
   a separate radio frequency interference (RFI) suppression sleeve having an inner circumferential surface engaging said outer circumferential surface of said main cover portion of said boot and in electrical communication with said conductive case of said spark plug such that interference produced by operation of said spark plug is suppressed by grounding through said conductive case but said sleeve does not provide a grounding path for a coil of the ignition system.

2. A spark plug RFI suppression arrangement as in claim 1, wherein said suppression sleeve has a cylindrical configuration with a first smaller diameter portion and a second larger diameter portion, a portion of said spark plug boot being received in said first smaller diameter portion.

3. A spark plug RFI suppression arrangement as in claim 2, wherein said suppression sleeve comprises an elastomeric material having conductive properties.

4. A spark plug RFI suppression arrangement as in claim 3, wherein said elastomeric material is selected from the group consisting of conductive polymer and conductive silicone.

5. A spark plug RFI suppression arrangement as in claim 3, wherein said suppression sleeve comprises a metallic conductor embedded in said elastomeric material.

6. A spark plug RFI suppression arrangement as in claim 5, wherein said metallic conductor comprises a wire coil.

7. A spark plug RFI suppression arrangement as in claim 5, wherein said metallic conductor comprises wire mesh.

8. A spark plug RFI suppression arrangement as in claim 2, wherein said conductive case of said spark plug includes an integral nut defining a plurality of wrench flats about its periphery, said second larger diameter portion of said suppression sleeve covering at least some of said nut.

9. A spark plug RFI suppression arrangement as in claim 8, wherein said suppression sleeve has a length such that it will partially cover said nut but not contact directly the engine block to which said spark plug is attached.

10. A spark plug RFI suppression arrangement as in claim 9, wherein said spark plug boot has main cover portion and an angled portion extending along said ignition wire, said first smaller diameter portion of said suppression sleeve abutting said angled portion.

11. A method of suppressing radio frequency interference (RFI) generated by a spark plug, said method comprising steps of:
   (a) acquiring a radio frequency interference (RFI) suppression sleeve having a generally cylindrical sleeve body formed of a conductive elastomeric material and a metallic conductor embedded in said elastomeric material;
   (b) slidably inserting a main cover portion of a spark plug boot into one open end of said sleeve such that an inner circumferential surface of a first portion of said sleeve will frictionally engage and be overlapping some of an outer circumferential surface of the spark plug boot but a second portion of said sleeve will extend beyond said spark plug boot; and
   (c) attaching a connector of an ignition wire to the terminal of a spark plug such that said spark plug boot covers a portion of said spark plug and said second portion of said sleeve covers an additional portion of the spark plug such that the second portion of the sleeve is in contact with a conductive case on the spark plug.

12. A method as in claim 11, wherein said first portion of said sleeve has a smaller diameter than said second portion of said sleeve.

13. A method as in claim 11, wherein said metallic conductor comprises a wire coil.

14. A method as in claim 11, wherein said metallic conductor comprises wire mesh.

* * * * *